United States Patent [19]
Sigmon et al.

[11] Patent Number: 6,097,252
[45] Date of Patent: Aug. 1, 2000

[54] METHOD AND APPARATUS FOR HIGH EFFICIENCY POWER AMPLIFICATION

[75] Inventors: Bernard Eugene Sigmon, Gilbert; Ronald Gene Myers, Scottsdale; Robert Michael Jackson, Gilbert, all of Ariz.

[73] Assignee: Motorola, Inc., Schaumburg, Ill.

[21] Appl. No.: 08/865,848

[22] Filed: Jun. 2, 1997

[51] Int. Cl.$^7$ .............................. H03G 3/30; H03F 3/68
[52] U.S. Cl. ...................... 330/136; 330/124 R; 330/285
[58] Field of Search ..................... 330/136, 285, 330/124 R, 295; 375/296, 297; 455/136, 285

[56] References Cited

U.S. PATENT DOCUMENTS

| | | | |
|---|---|---|---|
| 2,210,028 | 8/1940 | Doherty | 179/171 |
| 3,486,128 | 12/1969 | Lohrmann | 330/285 |
| 4,346,349 | 8/1982 | Yokoyama | 330/10 |
| 5,142,240 | 8/1992 | Isota et al. | 330/136 X |
| 5,251,330 | 10/1993 | Chiba et al. | 455/91 |
| 5,420,536 | 5/1995 | Faulkner et al. | 330/136 X |
| 5,568,086 | 10/1996 | Schuss et al. | 330/124 R |
| 5,757,229 | 5/1998 | Mizlaff | 330/136 X |

OTHER PUBLICATIONS

Publication entitled "Linearized Saturation Amplifier", Chiba et al., IEEE Global Telecommunications Conference & Exhibition in San Diego, CA. Conference Entitled Communications: Connecting the Future (Dec. 2–5, 1990) vol. 3 of 3.

Publication entitled "Intermodulation Distortion in Kahn–Technique Transmitters", Frederick H. Raab, IEEE Transactions on Microwave Theory and Techniques (Dec. 1996) vol. 44, No. 12 Part 01.

An article entitled "Single–Sideband Transmission By Envelope Elimination And Restoration" by Leonard R. Kahn from Proceedings of the I.R.E., 1952.

*Primary Examiner*—James B. Mullins
*Attorney, Agent, or Firm*—Dana B. LeMoine

[57] ABSTRACT

A method and apparatus for efficient power amplification over a wide dynamic range and for a number of modulation formats includes a carrier amplifier (30) and a peaking amplifier (40). The carrier amplifier (30) operates with a bias generated by an envelope amplifier (80) which amplifies the envelope of an input signal as generated by an envelope detector (70). The peaking amplifier (40) operates with a fixed bias. The outputs of the carrier amplifier (30) and the peaking amplifier (40) are combined using an impedance transforming network (50). Envelope amplifier (80) can be turned on for high efficiency low power level operation, or it can be turned off for standard Doherty-type operation.

20 Claims, 3 Drawing Sheets

METHOD AND APPARATUS FOR HIGH EFFICIENCY POWER AMPLIFICATION

FIELD OF THE INVENTION

This invention relates in general to power amplifiers and, in particular, to high efficiency power amplifiers.

BACKGROUND OF THE INVENTION

Modern communications systems continue to place ever-increasing performance demands on communications devices. Handheld communications devices in particular are subject to increasingly rigorous demands of smaller size and increased efficiency. At the same time, consumers expect these devices to have a continuously growing set of features.

For example, many handheld phones today are so-called "dual-use" phones. Dual-use phones allow users to communicate with two distinct types of communications systems. Most often, the different communications systems require different modulation formats, and these formats have widely varying dynamic ranges.

Along with features such as dual-use, consumers expect phones to be smaller, lighter, and to have longer talk times. Unfortunately, these desirable features often represent competing demands to be satisfied by the phone designer. For example, the simplest method of increasing talk time is to increase battery size, but this works against the goal of smaller size. One method of achieving increased talk time without increasing overall size is to make the device more efficient. This way, talk time as well as other desirable features can be enhanced without increasing the battery size.

Because the power amplifier is by far the largest consumer of power in handheld communications devices, increasing the efficiency of the power amplifier is very desirable. Increased power amplifier efficiency results in the ability to make smaller phones that have more features, including increased talk time. The demand for higher performance communications devices, and in particular, smaller dual-use phones with increased talk time, presents the phone designer with a difficult problem: how to design a power amplifier capable of operating efficiently for a number of different modulation formats and over a wide dynamic range.

One known method of increasing power amplifier efficiency is to use a Doherty-type power amplifier. Doherty-type amplifiers achieve an efficiency advantage over standard class AB and class B amplifiers near peak power, in part, by combining the output of two amplifiers which are biased differently. At low power levels, a first amplifier (carrier amplifier) is biased to operate linearly and a second amplifier (peaking amplifier) is off. At medium power levels, the carrier amplifier saturates while the peaking amplifier begins to turn on.

In this medium power region, the efficiency of the carrier amplifier remains at its maximum value since the carrier amplifier is saturated. The efficiency of the peaking amplifier increases from half of its maximum value at the transition point to its maximum value at system peak envelope power (PEP). As a result, the Doherty system achieves maximum efficiency at both the transition point and system PEP, and it remains relatively high in between.

The efficiency improvement of the Doherty-type amplifier is achieved from a medium power level on up, mainly because the carrier amplifier is saturated and is therefore operating very efficiently. Although considerably more efficient than a single, linear, non-saturating amplifier when operating at medium to high power levels, Doherty-type amplifiers are still quite inefficient at low power levels. When the peaking amplifier is off and the carrier amplifier is being driven by low level signals, the carrier amplifier operates in a linear region, and it is thus still inefficient.

Accordingly, there is a significant need for an efficient power amplifier capable of maintaining high efficiency while operating linearly over a wide dynamic range. There is also a significant need for a power amplifier capable of operating efficiently for a variety of modulation formats.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE DRAWINGS

Generally, the present invention helps solve the above-identified problems by providing a linear amplifier with high efficiency over a wide dynamic range. In addition, the present invention helps solve the above-identified problems by providing a power amplifier capable of operating efficiently for a variety of modulation formats.

In accordance with a first embodiment of the present invention, the apparatus includes a carrier amplifier which has a carrier signal input and a bias input, an envelope detector that detects the envelope of the input signal, and an envelope amplifier that conditionally amplifies the envelope signal and drives the bias input of the carrier amplifier. The envelope amplifier conditionally amplifies the envelope signal based on the state of a control input.

In accordance with another embodiment of the present invention, the apparatus includes a carrier amplifier which has a carrier signal input and a bias input, an envelope detector that detects the envelope of the input signal, an envelope amplifier that amplifies the envelope signal and drives the bias input of the carrier amplifier, and a peaking amplifier.

In accordance with another embodiment of the present invention, the apparatus includes a communications device which has a power amplifier including a carrier amplifier which has a carrier signal input and a bias input, an envelope detector that detects the envelope of the input signal, an envelope amplifier that amplifies the envelope signal and drives the bias input of the carrier amplifier, and a peaking amplifier.

In accordance with another embodiment of the present invention, a method of modulating a carrier amplifier includes the steps of envelope detecting an input signal to produce an envelope signal, conditionally amplifying the envelope signal to produce a bias signal, and modulating the carrier amplifier with the bias signal.

In accordance with another embodiment of the present invention, a method of producing an amplified output signal from an input signal having low and high power levels includes the steps of envelope detecting the input signal to produce an envelope signal, amplifying the envelope signal to produce a bias signal, modulating a carrier amplifier with the bias signal where the carrier amplifier amplifies the low power levels of the input signal, amplifying the high power levels of the input signal with a peak amplifier, and combining the output of the carrier amplifier and the output of the peak amplifier to produce the amplified output signal.

Figure 1:
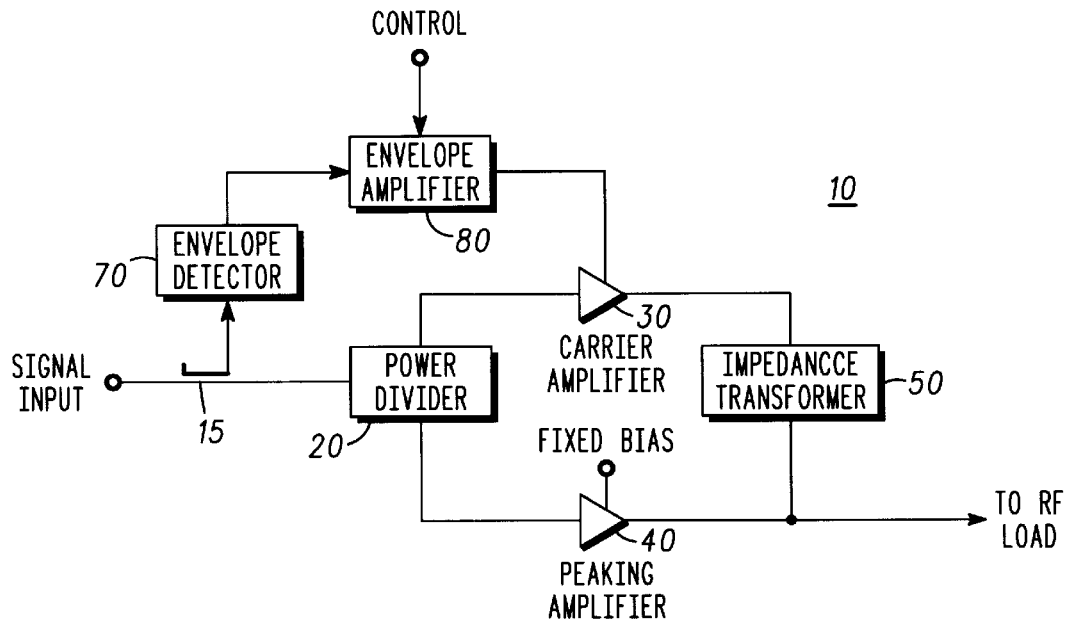
FIG. 1 shows a diagram of a power amplifier circuit in accordance with a preferred embodiment of the present invention.

FIG. 1 shows a diagram of a power amplifier circuit in accordance with a preferred embodiment of the present invention. Power amplifier circuit 10 includes power divider 20, carrier amplifier 30, peaking amplifier 40, and impedance transforming network 50. Power amplifier circuit 10 also includes signal coupler 15, envelope detector 70, and envelope amplifier 80.

Power divider 20, carrier amplifier 30, peaking amplifier 40, and impedance transforming network 50 form a Doherty-type network where carrier amplifier 30 amplifies low power level input signals, and peaking amplifier 40 amplifies large power level input signals. Power divider 20 divides the signal power into a carrier path and a peaking path for driving carrier amplifier 30 and peaking amplifier 40 respectively. Power divider 20 may produce phase shifts in the signal paths, and it preferably produces a 90 degree phase shift in the signal path leading to peaking amplifier 40. The phase shifts can be produced using a variety of methods, including a quarter wave transformer in the signal path.

Peaking amplifier 40 includes a signal input, which is driven by an output of power divider 20, and a bias input. Peaking amplifier 40 is biased such that for low signal levels, peaking amplifier 40 is off and consuming negligible power. When the input signal exceeds a preset threshold, peaking amplifier 40 turns on and operates linearly. At maximum input signal strength, peaking amplifier 40 saturates and operates in its most efficient region.

Carrier amplifier 30 includes a signal input and a bias input. The signal input of carrier amplifier 30 is driven by an output of power divider 20. The bias input is driven by envelope amplifier 80, as will be discussed in more detail below.

The embodiment of the power amplifier circuit as shown in FIG. 1 varies the bias of carrier amplifier 30 in such a way as to maintain operation near saturation and therefore in a region of high efficiency. Envelope detector 70 detects the envelope of the input signal and produces an envelope signal. The envelope signal is input to envelope amplifier 80, which then produces the bias signal for carrier amplifier 30. Because of its varying bias input, carrier amplifier 30 maintains operation at or near saturation, while the output of carrier amplifier 30 remains linear.

Envelope amplifier 80 receives a control signal, preferably a digital signal, which switches envelope amplifier 80 "on" and "off". When envelope amplifier 80 is "on", the envelope signal is amplified as previously described and the resulting bias signal drives the bias input of carrier amplifier 30. When envelope amplifier 80 is "off", a fixed bias is produced by envelope amplifier 80 regardless of the envelope signal, and carrier amplifier 30 operates with a fixed bias. When off, envelope amplifier 80 biases carrier amplifier 30 so that the combination of carrier amplifier 30 and peaking amplifier 40 operates as a classical Doherty-type amplifier.

In operation, when an output signal having a time varying amplitude is desired, and a large dynamic range is required, envelope amplifier 80 is turned on, and power amplifier circuit 10 operates as a Doherty-type amplifier with improved efficiency in carrier amplifier 30. When an output signal having a constant amplitude is desired, envelope amplifier is turned off and carrier amplifier 30 operates with a fixed bias. Carrier amplifier 30 and peaking amplifier 40 are preferably biased so that both are saturated when driving constant amplitude signals. When both amplifiers are saturated, maximum efficiency is attained.

Power amplifier circuit 10 combines the outputs of carrier amplifier 30 and peaking amplifier 40 through impedance transforming network 50. Impedance transforming network 50 acts as an impedance inverter and can be a T, L, or other suitable network, but it is preferably a quarter wave transmission line.

Impedance transforming network 50 introduces the same phase shift as the phase shift introduced by power divider 20. Because the phase shifts introduced in the carrier path and the peaking path are the same, the signals are summed in phase at the output of power amplifier circuit 10. In this way, the phase shift introduced by power divider 20 compensates for the phase shift introduced by impedance transforming network 50. Of course, the phase shifts in the two paths can be multiples of 2 pi while accomplishing the same result.

At low output levels, peaking amplifier 40 is cut off, and carrier amplifier 30 operates linearly. The impedance presented to carrier amplifier 30 by impedance transforming network 50 results in saturation of carrier amplifier 30 at a transition point well below the system PEP.

For output levels above the transition point, peaking amplifier 40 operates as a linear amplifier and acts as a controlled current source. Carrier amplifier 30 remains saturated, and it therefore acts as a voltage source. Because of the impedance inversion, the output of impedance transforming network 50 appears to be a current source. Since the load current due to peaking amplifier 40 increases the RF output voltage above that due to carrier amplifier 30, the impedance seen by the output end of impedance transforming network 50 is greater than the load impedance and increases with increasing output from peaking amplifier 40. The impedance inversion by impedance transforming network 50 therefore presents a decreasing load impedance to carrier amplifier 30, resulting in increasing output from it as well.

By modulating the carrier amplifier bias using the output of envelope amplifier 80, the high efficiency range of the Doherty-type amplifier is greatly enhanced. In the region of zero input power to the transition point, where a conventional Doherty-type amplifier is most inefficient, the amplifier of the present invention maintains high efficiency.

One example of an advantageous use of the present invention is a dual-use phone such as an AMPS/CDMA phone. When in AMPS operation, an FM modulation format is employed, which typically requires a relatively high power, constant amplitude output. When in CDMA operation, the modulation format requires linear operation over a much wider dynamic range than that required for AMPS.

Power amplifier circuit 10 is capable of operating at high efficiency for both constant amplitude modulation formats, such as in AMPS, and also for modulation formats requiring large dynamic ranges, such as CDMA. Because multiple signal types can be efficiently amplified using power amplifier circuit 10, the present invention allows dual-use phones and other communications devices to operate more efficiently. The resulting power savings allows these communications devices to be smaller, lighter, and to have increased talk time.

Envelope amplifier 80 can be an inexpensive and efficient amplifier that operates at the bandwidth of the envelope of the input signal. One skilled in the art will recognize that there are many possible ways to implement envelope amplifier 80, but a preferred embodiment is set forth in FIG. 2.

Figure 2:
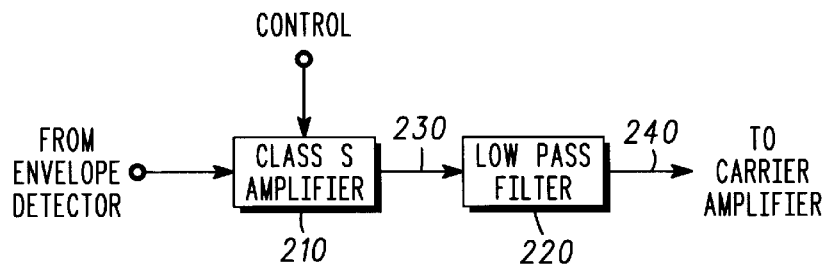
FIG. 2 shows a diagram of an envelope amplifier in accordance with a preferred embodiment of the present invention.

FIG. 2 shows a diagram of an envelope amplifier in accordance with a preferred embodiment of the present invention. Envelope amplifier 80 includes class S amplifier 210 and low pass filter 220. Class S amplifier 210 is a pulsewidth modulating amplifier which can operate at very high efficiency. When Class S amplifier 210 is on, a pulsewidth modulated signal is produced at node 230 which has a duty cycle proportional to the amplitude of the envelope signal. The pulsewidth modulated signal at node 230 travels through low pass filter 220 to produce the bias signal at node 240. When class S amplifier is on, the bias signal at node 240 is an amplified replica of the envelope signal which is input to class S amplifier 210. When envelope amplifier 80 is off, class S amplifier 210 produces a pulsewidth modulated signal with a substantially constant duty cycle. The pulsewidth modulated signal at node 230 will have a substantially constant duty cycle regardless of the envelope signal characteristics. The pulsewidth modulated signal at node 230 passes through low pass filter 220 to produce a fixed bias signal at node 240.

Envelope amplifier 80, as shown in FIG. 2, uses a class S amplifier to obtain high efficiency when the envelope signal is being amplified. Envelope amplifier 80 also uses class S amplifier 210 when a fixed output bias signal is required. Of course, other methods of producing a fixed bias output are contemplated. When envelope amplifier 80 is turned off, class S amplifier 210 could also be turned off, and a fixed bias could be introduced with a switch, or by other suitable means.

Figure 3:
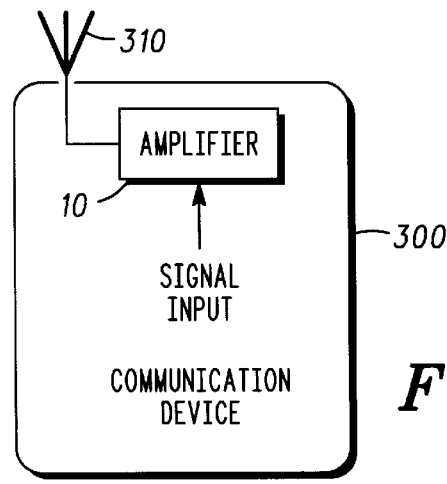
FIG. 3 shows a diagram of a communications device in accordance with a preferred embodiment of the present invention.

FIG. 3 shows a diagram of a communications device in accordance with a preferred embodiment of the present invention. Communications device 300 includes power amplifier circuit 10 and antenna 310. Communications device 300 may be one of many different devices capable of communications. Examples include, but are not limited to, dual-use phones, individual subscriber units in a satellite communications system, amateur radios, business band radios, and cellular phones.

Figure 4:
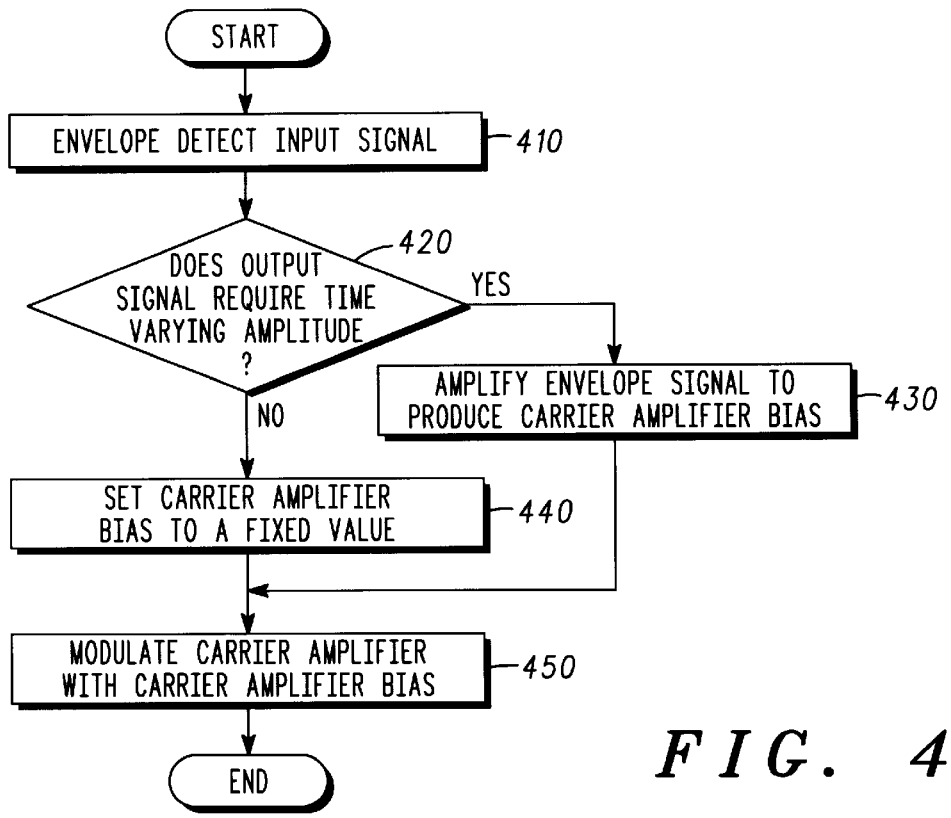
FIG. 4 shows a flow chart for a method of modulating a carrier amplifier in accordance with a preferred embodiment of the present invention.

FIG. 4 shows a flowchart for a method of modulating a carrier amplifier in accordance with a preferred embodiment of the present invention. In step 410, the input signal is envelope detected. Step 420 is a decision block that determines whether the output signal requires a time varying amplitude. If the output signal requires a time varying amplitude then step 430 is executed where the envelope signal is amplified to produce the carrier amplifier bias. If, in step 420, the output signal does not require a time varying amplitude then step 440 is executed which sets the carrier amplifier bias to a fixed value. Both steps 430 and 440 pass operation to step 450 which modulates the carrier amplifier with the carrier amplifier bias.

Figure 5:
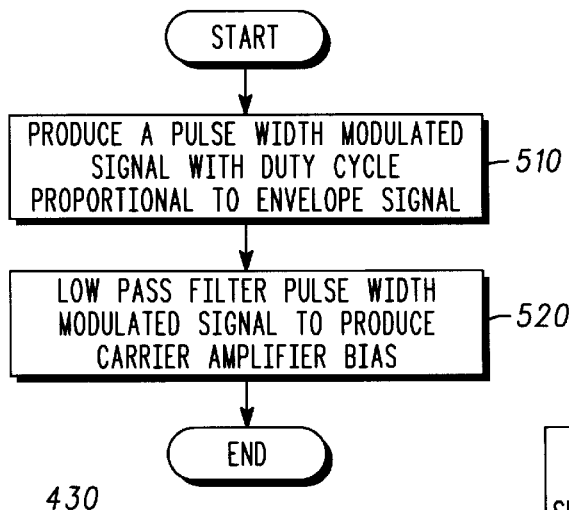
FIG. 5 shows a flow chart for a method of amplifying an envelope signal in accordance with a preferred embodiment of the present invention.

FIG. 5 expands on a preferred method for step 430 of FIG. 4. FIG. 5 shows a flowchart for a method of amplifying an envelope signal in accordance with a preferred embodiment of the present invention. In step 510 a pulsewidth modulated signal is produced which has a duty cycle proportional to the amplitude of the envelope signal. Then in step 520, the pulsewidth modulated signal is low pass filtered to produce the carrier amplifier bias.

Figure 6:
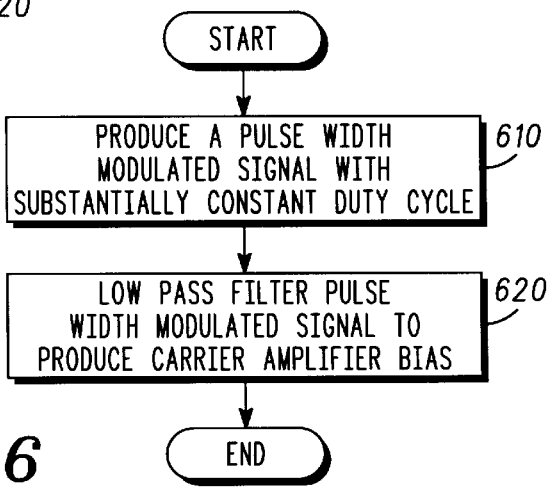
FIG. 6 shows a flow chart for a method of setting a carrier amplifier bias in accordance with a preferred embodiment of the present invention.

FIG. 6 expands on step 440 of FIG. 4. FIG. 6 shows a flowchart for a method of setting a carrier amplifier bias in accordance with a preferred embodiment of the present invention. In step 610 a pulsewidth modulated signal is produced which has a substantially constant duty cycle. Then in step 620, the pulsewidth modulated signal is low pass filtered to produce the carrier amplifier bias.

Figure 7:
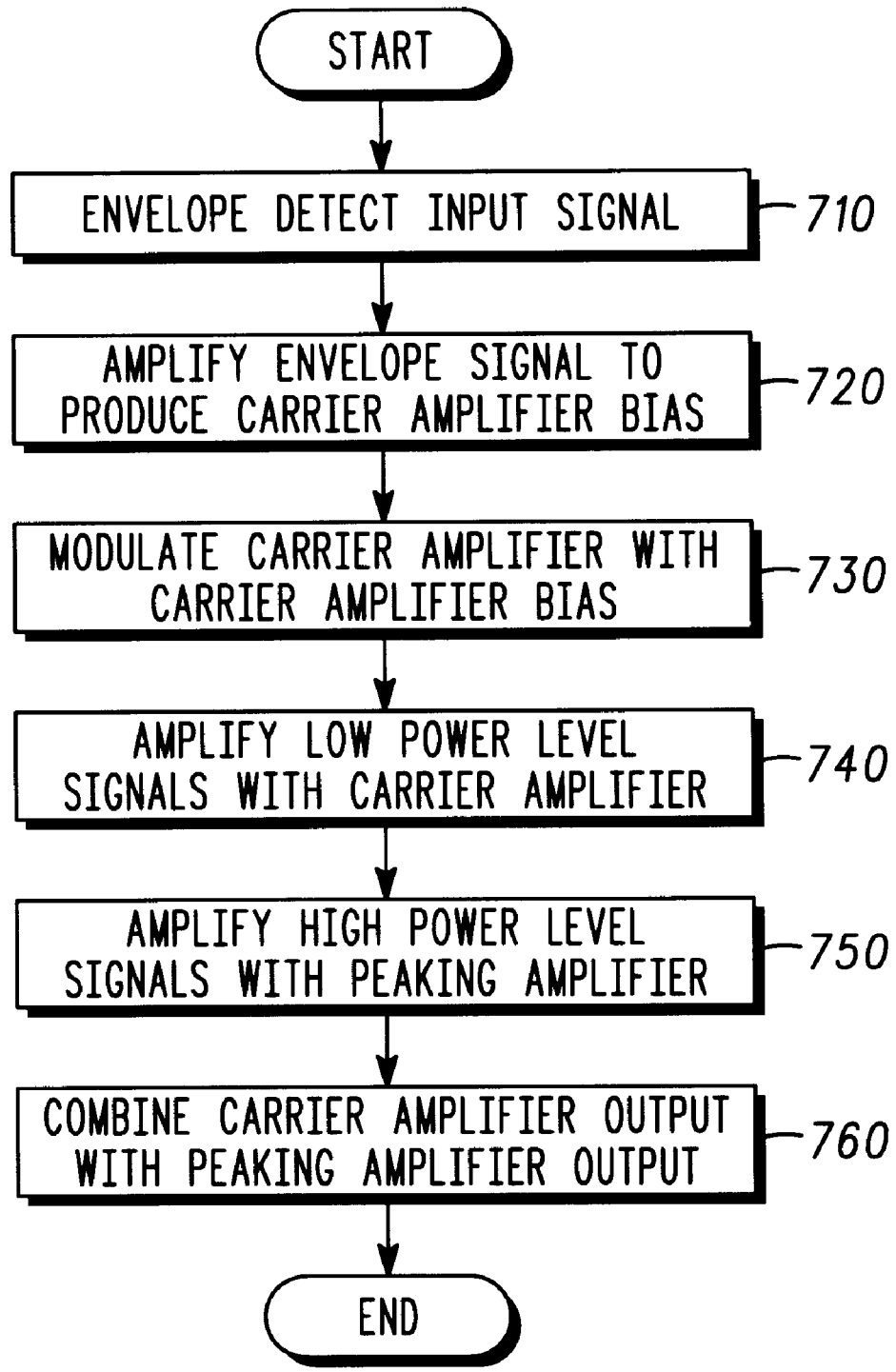
FIG. 7 shows a flow chart for a method of producing an amplified output signal in accordance with a preferred embodiment of the present invention.

FIG. 7 shows a flowchart for a method of producing an amplified output signal in accordance with a preferred embodiment of the present invention. In step 710 an input signal is envelope detected. Then, in step 720, the envelope signal is amplified to produce a carrier amplifier bias signal. Then, in step 730, a carrier amplifier is modulated with the carrier amplifier bias signal. In step 740, low power level input signals are amplified with the carrier amplifier which was modulated in the previous step. In step 750, high power level input signals are amplified with a peaking amplifier. And finally, in step 760, the carrier amplifier output is combined with the peaking amplifier output.

In summary, the method and apparatus of the present invention as described is a versatile way of achieving high efficiency power amplifier operation while satisfying CDMA and AMPS modulation scheme requirements, while also providing the ability to operate in a conventional Doherty-type amplifier configuration. The increased efficiency allows communications devices to be built smaller and lighter while increasing talk time.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A power amplifier circuit comprising:
   a carrier amplifier having a carrier signal input, a carrier signal output, and a bias input, wherein said carrier signal input is coupled to an input of said power amplifier circuit and said carrier signal output is coupled to an output of said power amplifier circuit;
   an envelope detector coupled to said input of said power amplifier circuit, wherein said envelope detector produces an envelope signal; and
   an envelope amplifier having a signal input responsive to said envelope signal, an output coupled to said bias input, a control input driven by a control signal, which causes said envelope amplifier to operate in one of two states, wherein when said control signal is in a first state, said envelope amplifier operates in an on state, said envelope signal is amplified by said envelope amplifier, and said bias input is driven by an amplified replica of said envelope signal, and when said control signal is in a second state, said envelope amplifier operates in an off state, said envelope amplifier produces a fixed bias which is independent of said envelope signal, and said bias input is driven by said fixed bias.

2. The power amplifier circuit of claim 1 wherein said envelope amplifier comprises a class S amplifier.

3. The power amplifier circuit of claim 1 wherein said envelope amplifier comprises a pulsewidth modulating amplifier and a low pass filter.

4. The power amplifier circuit of claim 1 further comprising:
   a peaking amplifier having an input coupled to said input of said power amplifier circuit, and an output coupled to said output of said power amplifier circuit; and
   an impedance transforming network for coupling said output of said carrier amplifier and to said output of said power amplifier circuit.

5. The power amplifier circuit of claim 4 wherein said peaking amplifier is off for low input signal levels and on for large input signal levels.

6. A power amplifier circuit comprising:
   a carrier amplifier having a carrier signal input, a bias input, and an output, wherein said carrier signal input is coupled to an input of said power amplifier circuit, and said output of said carrier amplifier is coupled to an output of said power amplifier circuit;
   an envelope detector coupled to said input of said power amplifier circuit for producing an envelope signal;
   an envelope amplifier having an input responsive to said envelop signal, an output coupled to said bias input, a control input driven by a control signal, which causes said envelope amplifier to operate in one of two states, wherein when said control signal is in a first state, said envelope amplifier operates in an on state, said envelope signal is amplified by said envelope amplifier, and said bias input is driven by an amplified replica of said envelope signal, and when said control signal is in a second state, said envelope amplifier operates in an off state, said envelope amplifier produces a fixed bias which is independent of said envelope signal, and said bias input is driven by said fixed bias; and
   a peaking amplifier having an input coupled to said input of said power amplifier circuit, and an output coupled to said output of said power amplifier circuit.

7. The power amplifier circuit of claim 6 further comprising an impedance transforming network which couples said output of said carrier amplifier to said output of said power amplifier circuit.

8. The power amplifier circuit of claim 7 further comprising:
   a power divider which couples said carrier signal input of said carrier amplifier and said input of said peaking amplifier to said input of said power amplifier circuit, wherein said power divider causes a phase shift which compensates for said impedance transforming network.

9. The power amplifier circuit of claim 6 wherein said envelope amplifier comprises a pulsewidth modulating amplifier which produces a pulsewidth modulated signal having a duty cycle proportional to the amplitude of said envelope signal and a low pass filter which filters said pulsewidth modulated signal to produce a carrier amplifier bias which is used to drive said bias input.

10. The power amplifier circuit of claim 9 wherein said pulsewidth modulating amplifier comprises a class S amplifier.

11. A communications device including a power amplifier circuit wherein said power amplifier circuit comprises:
   a carrier amplifier having a carrier signal input, a bias input, and an output, wherein said carrier signal input is coupled to an input of said power amplifier circuit, and said output of said carrier amplifier is coupled to an output of said power amplifier circuit;
   an envelope detector coupled to said input of said power amplifier circuit for producing an envelope signal;
   an envelope amplifier having an input responsive to said envelope signal, an output coupled to said bias input, a control input driven by a control signal, which causes said envelope amplifier to operate in one of two states, wherein when said control signal is in a first state, said envelope amplifier operates in an on state, said envelope signal is amplified by said envelope amplifier, and said bias input is driven by an amplified replica of said envelope signal, and when said control signal is in a second state, said envelope amplifier operates in an off state, said envelope amplifier produces a fixed bias which is independent of said envelope signal, and said bias input is driven by said fixed bias; and
   a peaking amplifier having an input coupled to said input of said power amplifier circuit, and an output coupled to said output of said power amplifier circuit.

12. The communications device of claim 11 wherein said power amplifier circuit further comprises an impedance transforming network which couples said output of said carrier amplifier to said output of said power amplifier circuit.

13. The communications device of claim 12 wherein said power amplifier circuit further comprises:
   a power divider which couples said carrier signal input of said carrier amplifier and said input of said peaking amplifier to said input of said power amplifier circuit, wherein said power divider causes a phase shift which compensates for said impedance transforming network.

14. The communications device of claim 11 wherein said peaking amplifier is off for low input signal levels and on for large input signal levels.

15. The communications device of claim 11 wherein said envelope amplifier comprises a pulsewidth modulating amplifier and a low pass filter.

16. The communications device of claim 15 wherein said pulsewidth modulating amplifier comprises a class S amplifier.

17. The communications device of claim 16 wherein said said communications device comprises a dual-use phone.

18. A method of modulating a carrier amplifier, said method comprising the steps of:
   envelope detecting an input signal to produce an envelope signal;
   determining from a control signal when a time varying amplitude is required;
   amplifying said envelope signal to produce a bias signal when said control signal is in a first state;
   producing a fixed bias for said bias signal when said control signal is in a second state; and
   modulating said carrier amplifier with said bias signal.

19. The method of claim 18 wherein said amplifying step comprises the steps of:
  producing a pulsewidth modulated signal having a duty cycle when said control signal is in said first state, said duty cycle being proportional to the amplitude of said envelope signal; and
  filtering said pulsewidth modulated signal to produce said bias signal.

20. The method of claim 18 wherein said producing step comprises the steps of:
  producing a pulsewidth modulated signal having a substantially constant duty cycle when said control signal is in said second state; and
  filtering said pulsewidth modulated signal to produce said bias signal.

* * * * *